United States Patent [19]
Huang et al.

[11] Patent Number: 5,670,389
[45] Date of Patent: Sep. 23, 1997

[54] SEMICONDUCTOR-ON-INSULATOR DEVICE HAVING A LATERALLY-GRADED CHANNEL REGION AND METHOD OF MAKING

[75] Inventors: Wen-Ling Margaret Huang, Phoenix; Hyungcheol Shin, Gilbert; Marco Racanelli, Phoenix, all of Ariz.

[73] Assignee: Motorola, Inc., Schaumburg, Ill.

[21] Appl. No.: 585,137

[22] Filed: Jan. 11, 1996

[51] Int. Cl.$^6$ .................... H01L 21/265; H01L 21/84
[52] U.S. Cl. ........................... 437/21; 437/44; 437/45
[58] Field of Search ........................... 437/40, 21, 41, 437/44–45

[56] References Cited

U.S. PATENT DOCUMENTS

| 4,599,118 | 7/1986 | Han et al. |  |
|---|---|---|---|
| 5,185,280 | 2/1993 | Houston et al. | 437/44 |
| 5,506,161 | 4/1996 | Orlowski et al. | 437/44 |

OTHER PUBLICATIONS

Ghavam G. Shahidi et al. "SOI for Low–Voltage and High–Speed CMOS", Extended Abstracts of the 1994 International Conference on Solid State Devices and Materials, Yokohama, 1994, pp. 265–267, Month Unknown.

G.G. Shahidi et al. "A Room Temperature 0.1 μm CMOS On SOI", 1993 Symposium On VLSI Technology, Digest of Technical Papers, pp. 27–28, May, 1993.

G. Shahidi et al. "SOI For a 1–Volt CMOS Technology and Application to a 512Kb SRAM With 3.5 ns Access Time", IEDM, pp. 33.2.1–33.2.4, Dec. 1993.

*Primary Examiner*—John Niebling
*Assistant Examiner*—Richard A. Booth
*Attorney, Agent, or Firm*—Rennie William Dover

[57] ABSTRACT

A silicon-on-insulator semiconductor device (40) having laterally-graded channel regions (23A, 24A) and a method of making the silicon-on-insulator semiconductor device (40). The silicon-on-insulator semiconductor device (40) has a gate structure (16) having sidewalls (19, 21) on a semiconductor layer (12). Lightly doped regions (26A, 27A) extend through an entire thickness of a portion of the semiconductor layer (12) under the sidewalls (19, 21). A laterally-graded channel region (23A) is formed below the gate structure (16) and abutting one (26A) of the lightly doped regions. A source (33) is formed in a first (26A) of the lightly doped regions and a drain region (34) is formed in a second (27A) of the lightly doped regions.

9 Claims, 2 Drawing Sheets

SEMICONDUCTOR-ON-INSULATOR DEVICE HAVING A LATERALLY-GRADED CHANNEL REGION AND METHOD OF MAKING

BACKGROUND OF THE INVENTION

The present invention relates, in general, to a semiconductor device, and more particularly, to a semiconductor device fabricated on a semiconductor-on-insulator substrate.

In semiconductor-on-insulator (SOI) technology, semiconductor devices such as, for example, field effect transistors (FETs), are manufactured on a substrate comprised of a layer of semiconductor material disposed on a layer of insulating material. SOI technology provides several advantages over a conventional bulk technology including a reduced number of processing steps, elimination of latchup in complementary metal oxide semiconductor (CMOS) circuits, higher transistor density, reduction in parasitic capacitance, improved device isolation, superior radiation hardness, etc.

In SOI technology, the threshold voltage of a FET is controlled by, among other things, the doping level in the channel region of the FET. Typically, the doping level in the channel region is set by implanting a dopant or impurity material into an active region of the SOI substrate. The implanted dopant diffuses during subsequent high temperature processing steps to form a uniformly doped channel region. In addition, the dopant segregates into the insulator portion of the SOI substrate, making the transistor edge more sensitive to process induced charge which can lead to leakage current. Increasing the doping near the device isolation edge will reduce this effect but this can worsen the "narrow-channel" effect, wherein the threshold voltage increases as the device width decreases. Further, the threshold voltage does not reach a steady state value until after a settling time of up to approximately 10 seconds due to device floating body effect. The settling time is also referred to as a device transient time. Another limitation of these types of semiconductor devices is the large change in threshold voltage with different drain biasing conditions due to the floating body effect of the device.

Accordingly, it would be advantageous to have an SOI device that is less sensitive to process charge induced edge leakage with reduced device floating body effect and a method for manufacturing the device. It would be of further advantage for the method to not increase the series resistance of the device and to be cost efficient.

DETAILED DESCRIPTION OF THE DRAWINGS

Generally, the present invention provides a semiconductor-on-insulator (SOI) semiconductor device having a laterally-graded channel region and a method for manufacturing the SOI device. In accordance with one embodiment of the present invention, laterally-graded channel regions are formed under a gate structure and adjacent to the source and drain regions. Further, the portions of an active region of the SOI device that are not under the gate structure are of a single conductivity type. An advantage of this type of doping profile is that it makes the device less sensitive to process charge induced leakage current without increasing the series resistance of the device. In addition, the transient time of the device, i.e., the time required for the device to reach a steady state level, is reduced.

Figure 1:
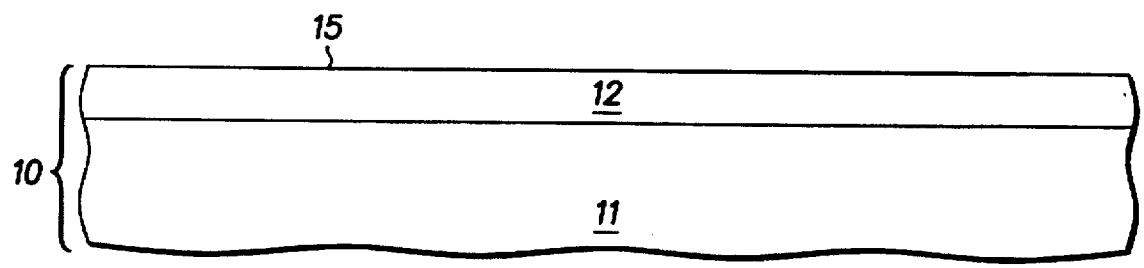
FIGS. 1-6 illustrate cross-sectional views of an SOI device during various stages of manufacture in accordance with a first embodiment of the present invention.

FIG. 1 illustrates an enlarged cross-sectional view of an SOI substrate 10 which is comprised of a layer of semiconductor material 12 disposed on a layer of insulator material 11, wherein layer of semiconductor material 12 has a major surface 15. SOI substrate 10 is formed using conventional processing techniques such as, for example, separation by implantation of oxygen (SIMOX), wafer bonding, etc. As those skilled in the art are aware, insulator material 11 may be disposed on a layer of semiconductor material (not shown). In other words, insulator material 11 is sandwiched between two layers of semiconductor material. In accordance with a first embodiment of the present invention, layer of insulator material 11 is oxide having a thickness ranging between approximately 0.05 microns (μm) and approximately 4 μm, and layer of semiconductor material 12 is silicon having an initial thickness ranging between approximately 0.01 μm and 0.6 μm. Preferably, oxide layer 11 has a thickness of 0.4 μm and silicon layer 12 has a thickness of 0.2 μm.

It should be understood that the thicknesses and types of material for layer of insulator material 11 and layer of semiconductor material 12 are not limitations of the present invention. For example, layer of dielectric material 11 formed using a SIMOX process has a thickness ranging between approximately 0.05 μm and 0.5 μm, whereas dielectric material 11 formed using a wafer bonding process has a thickness ranging between approximately 0.05 μm and 4 μm. Other suitable materials for layer of dielectric material 11 include sapphire, glass, and the like. Likewise, layer of semiconductor material 12 has an initial thickness ranging between approximately 0.01 μm and 0.6 μm. Other suitable materials for layer 12 include silicon germanium, gallium arsenide, indium phosphide, and the like. It should be noted that silicon layer 12 is kept thin for high speed, low power applications.

Figure 2:
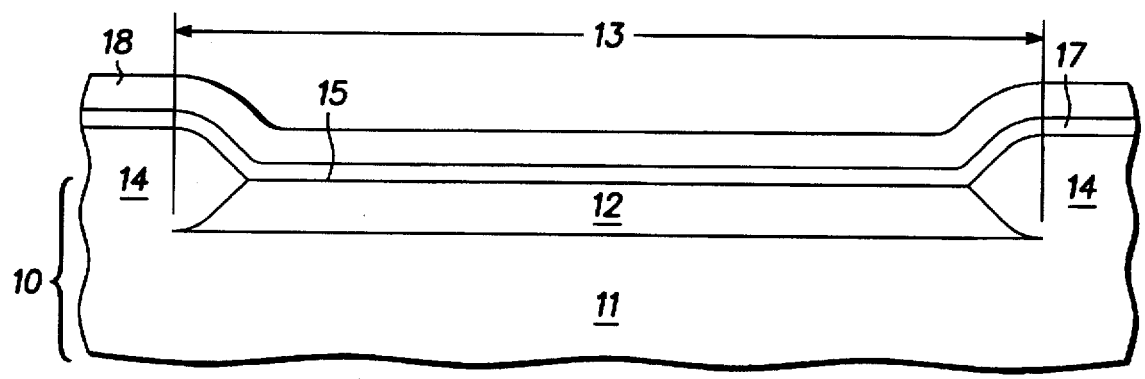

FIG. 2 illustrates a cross-sectional view of SOI substrate 10 further along in processing. More particularly, an active area or active region 13 is formed in silicon layer 12 using, for example, a local oxidation of silicon (LOCOS) technique. Other techniques for forming active regions in an SOI substrate include Poly-Buffered LOCOS (PBL), mesa or trench isolation, and the like. Active region 13 is electrically isolated from other active regions (not shown) by field oxide regions 14. It should be understood that the same reference numerals are used in the figures to denote the same elements.

Still referring to FIG. 2, a sacrificial oxide (not shown) is formed over active region 13 and an impurity material is implanted into active region 13 to adjust the threshold voltage, $V_t$, of the semiconductor device. For an n-channel field effect transistor, the impurity material is a p-type dopant such as, for example, boron. It should be understood that a single implant or multiple implants can be used to adjust the threshold voltage. For a multiple implant process, a first $V_t$ adjust implant is tailored such that the peak or maximum dopant concentration of the boron is placed in a portion of active region 13 adjacent oxide layer 11. For an active region 13 that is 100 nm thick and having an overlying sacrificial oxide layer (not shown) that is 150 nm thick, a first boron implant is performed, wherein the first implant dose ranges from approximately $5 \times 10^{11}$ to $1 \times 10^{13}$ atoms per centimeter squared (atoms/cm$^2$) and the first implant energy is approximately 90 kilo-electron volts (KeV). A second $V_t$ adjust implant is tailored such that the peak dopant concentration of the boron is placed in a portion of active region 13 between major surface 15 and the interface between silicon layer 12 and oxide layer 11. For example, the second implant dose ranges from approximately $5 \times 10^{11}$ to $1 \times 10^{13}$ atoms/cm$^2$ and the second implant energy is approximately 45 KeV. It is well known that the actual implant energies and doses are dependent upon the thicknesses of active region 13 and the sacrificial oxide (not shown), as well as on the desired performance characteristics of the device being fabricated.

Although the threshold voltage has been described as being adjusted prior to formation of a gate structure, it should be understood that this is not a limitation of the present invention. In another example, the threshold voltage is adjusted after formation of polysilicon layer 18. In yet another example, the threshold voltage is adjusted after formation of a gate structure (identified by reference number 16 in FIG. 3). Techniques for forming active regions or areas on an SOI device and adjusting the threshold voltage are described in copending U.S. patent application Ser. No. 08/552,656, entitled "FABRICATION METHOD FOR A SEMICONDUCTOR DEVICE ON A SEMICONDUCTOR ON INSULATOR SUBSTRATE", filed on Nov. 3, 1995, by Marco Racanelli et al., and assigned to the same assignee, Motorola, Inc. Additional techniques for adjusting the threshold voltage are described in U.S. Pat. No. 5,532,175, entitled "METHOD OF ADJUSTING A THRESHOLD VOLTAGE FOR A SEMICONDUCTOR DEVICE FABRICATED ON A SEMICONDUCTOR ON INSULATOR SUBSTRATE", filed on Apr. 17, 1995, by Marco Racanelli et al., and assigned to the same assignee, Motorola, Inc. Copending U.S. patent application having Ser. No. 08/552,656 and U.S. Pat. No. 5,532,175 are hereby incorporated herein by reference.

Still referring to FIG. 2, a gate oxide layer 17 having a thickness ranging between approximately 5 nanometers (nm) and 40 nm is thermally grown on active region 13. A layer of polysilicon 18 is deposited on gate oxide layer 17, wherein layer of polysilicon 18 has a thickness ranging between approximately 100 nm and 500 nm. A portion of layer of polysilicon 18 serves as a gate material. The thickness of polysilicon layer 18 is selected to be the desired final height of a gate structure of the completed semiconductor device.

Figure 3:
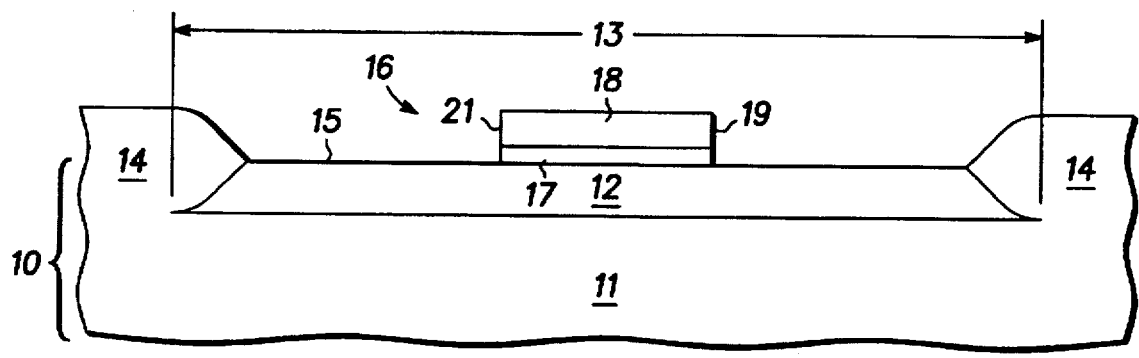

Now referring to FIG. 3, a layer of photoresist (not shown) is coated on polysilicon layer 18 and patterned to form an etch mask, wherein the portions of polysilicon layer 18 to be removed are exposed. The exposed portions of polysilicon layer 18 are removed using, for example, reactive ion etching (RIE). It should be understood that although gate oxide layer 17 is shown as being removed adjacent to gate structure 16, this is not a limitation of the present invention. Thus, in an alternate embodiment, portions of gate oxide layer 17 adjacent sidewalls 19 and 21 remain. The remaining portions of gate oxide layer 17 and layer of polysilicon 18 form gate structure 16, wherein gate structure 16 has sidewalls or edges 19 and 21. The layer of photoresist is removed using techniques well known to those skilled in the art.

Figure 4:
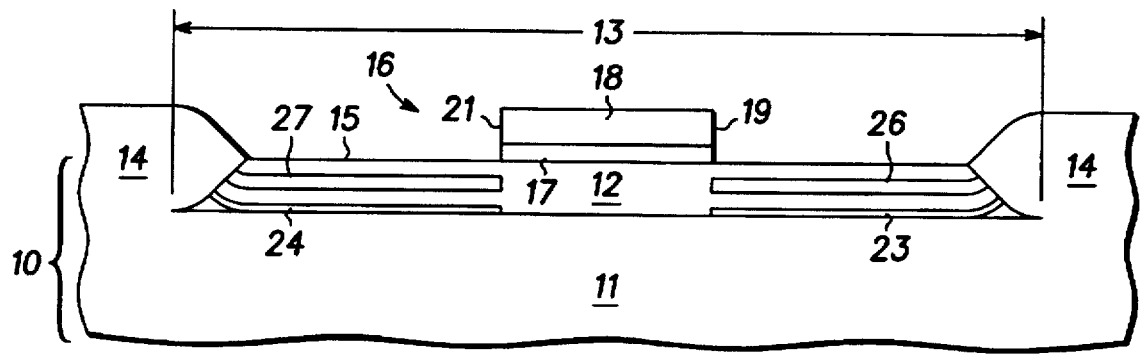

Now referring to FIG. 4, a layer of photoresist (not shown) is coated on SOI substrate 10 and patterned to expose gate structure 16 and the portions of active region 13 adjacent to gate structure 16. A p-type dopant such as, for example, boron, is implanted into active region 13 to form doped regions 23 and 24. It should be noted that a p-type dopant is also referred to as an impurity material of p conductivity type. Preferably, the implant is a zero degree implant using an implant energy sufficient to form doped regions 23 and 24 at portions of silicon layer 12 adjacent to the interface between silicon layer 12 and oxide layer 11. In other words, the implant energy is selected such that the peak concentration of the p-type dopant is in a portion of silicon layer 12 adjacent to the interface between silicon layer 12 and oxide layer 11. Further, the implant energy is not sufficient for the p-type dopant to penetrate the portion of active region 13 under gate structure 16. By way of example, the implant energy of the boron is 35 KeV and the dose is $1 \times 10^{14}$ atoms/cm$^2$.

Next, an n-type dopant such as, for example, phosphorus is implanted into active region 13 to form doped regions 26 and 27. The n-type dopant is also referred to as an impurity material of n conductivity type. Preferably, the implant is a zero degree implant using an implant energy sufficient to form doped region 26 between doped region 23 and a portion of major surface 15 adjacent sidewall 19 and to form doped region 27 between doped region 24 and a portion of major surface 15 adjacent sidewall 21. In other words, the implant energy is selected such that the peak concentration of the n-type dopant is between doped region 23 and a portion of major surface 15 adjacent sidewall 19 and between doped region 24 and a portion of major surface 15 adjacent sidewall 21. Further, the implant energy is not sufficient for the n-type dopant to penetrate the portion of active region 13 under gate structure 16. By way of example, the implant energy of the phosphorus is 30 KeV and the dose is $2.5 \times 10^{14}$ atoms/cm$^2$. It should be noted that implants having an implant angle other than zero degrees can also be used to form doped regions 23, 24, 26, and 27.

In accordance with the first embodiment, the boron and phosphorus implants which form doped regions 23 and 26 on one side of gate structure 19 and doped regions 24 and 27 on an opposing side of gate structure 16 are self-aligned to the respective sidewalls 19 and 21 of gate structure 16. It should be understood that the ratio of the net dose of the dopant in the silicon for forming the n-type doped regions 26 and 27 to the net dose of the dopant in the silicon for forming the respective p-type doped regions 23 and 24 should be at least one, and that preferably the ratio ranges up to ten. It should be understood that the ratio of the dopant net doses in the silicon is not a limitation of the present invention and that the ratio may be greater than ten. In the embodiments described with reference to FIG. 4, the ratio of the net doses of the n-type dopant to the p-type dopant used for forming doped regions 26 and 23 in silicon layer 12 is five. Likewise, the ratio of the net doses of the n-type dopant to the p-type dopant used for forming doped regions 27 and 24 in silicon layer 12 is five. Thus, the net dose of the n-type dopant of doped regions 26 and 27 is five times the net dose of the p-type dopant of doped regions 23 and 24, respectively. A ratio of net doses of at least one ensures that the n-type dopant compensates the p-type dopant in portions of active region 13 that are not beneath or under gate structure 16. Although, doped regions 23 and 24 are described as being formed before doped regions 26 and 27, it should be understood that this is not a limitation of the present invention, and that doped regions 26 and 27 can be formed before doped regions 23 and 24.

Figure 5:
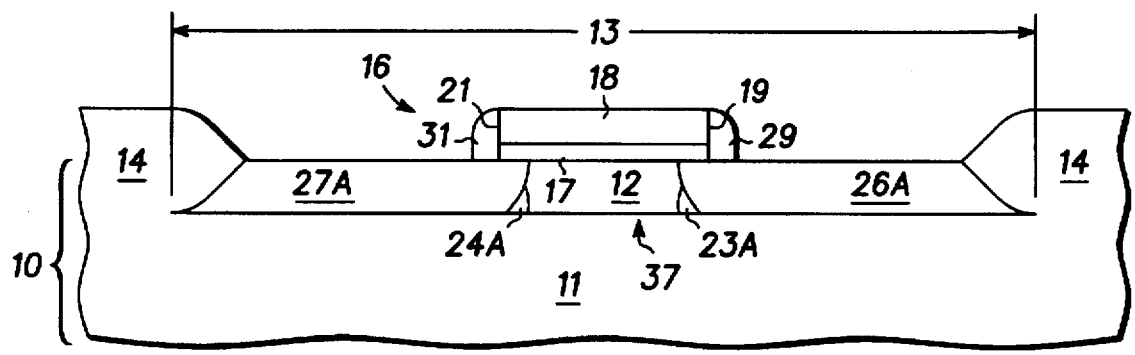

After the formation of doped regions 26 and 27, the layer of photoresist is removed and the p and n type dopants are activated as illustrated in FIG. 5. Activation of the p-type and n-type dopants causes them to diffuse both laterally and vertically thereby forming laterally-graded channel regions 23A and 24A and lightly-doped regions 26A and 27A. Lightly doped regions 26A and 27A are commonly referred to as lightly doped drain (LDD) regions. Those skilled in the art are aware that the lightly doped regions can be formed on both the drain and the source side of a gate structure. Since the dose of the n-type dopant is greater than the dose of the p-type dopant, the n-type dopant of lightly doped regions 26A and 27A compensates the p-type dopant of doped regions 23 and 24. Thus, lightly-doped drain regions 26A and 27A extend throughout the portions of active region 13 aligned and adjacent to sidewalls 19 and 21, respectively. In other words, lightly doped regions 26A and 27A extend from the portions of major surface 15 below sidewalls 19 and 21, respectively, through active region 13, to oxide layer 11, and laterally extend in a direction away from gate structure 16. Accordingly, the p-type laterally-graded channel regions 23A and 24A are formed adjacent to and abutting the lightly doped regions 26A and 27A, respectively, that are between gate structure 16 and oxide layer 11, i.e., the portions of active region 13 beneath gate structure 16.

Still referring to FIG. 5, spacers 29 and 31 are formed adjacent to sidewalls 19 and 21, respectively, of gate structure 16 using techniques well known to those skilled in the art. For example, spacers 29 and 31 may be formed by depositing a layer of silicon dioxide (not shown) on gate structure 16, the exposed portions of active region 13, and oxide region 14. The deposited layer of silicon dioxide is anisotropically etched using, for example, an RIE etch, to form spacers 29 and 31.

Figure 6:
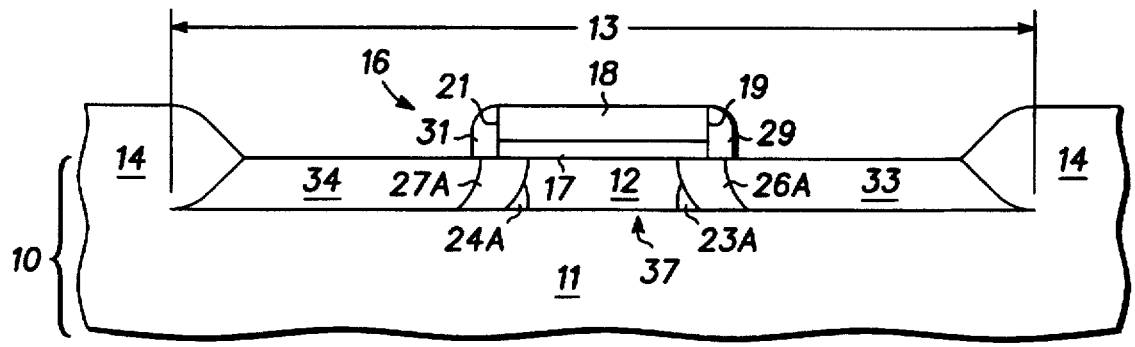

Now referring to FIG. 6, a layer of photoresist (not shown) is formed over SOI substrate 10. The layer of photoresist is patterned to expose portions of active region 13, gate structure 16, and spacers 29 and 31. An n-type dopant is implanted into the portions of lightly doped region 26A adjacent spacer 29 to form source region 33 of SOI semiconductor device 40. Likewise, the n-type dopant is implanted into the portions of lightly doped region 27A adjacent spacer 31 to form drain region 34 of SOI semiconductor device 40. The implant energy used to form source and drain regions 33 and 34, respectively, is selected so that layer 18 of gate structure 16 is doped by the n-type dopant. However, gate structure 16 prevents the dopant from penetrating the portion of active region 13 under gate structure 16. By way of example, the n-type dopant is phosphorus which is implanted at a dose of $5 \times 10^{15}$ atoms/cm$^2$ and an implant energy of 40 KeV. Since the dose of the n-type dopant forming source and drain regions 33 and 34, respectively, is larger than the dose of the n-type dopant forming lightly doped regions 26A and 27A, the concentration of the n-type dopant of source and drain regions 33 and 34, respectively, is higher than the concentration of the n-type dopant of lightly doped regions 26A and 27A. The portion of active region 13 under gate structure 16 and between lightly doped regions 26A and 27A serves as a channel region 37. The layer of photoresist is removed.

Although spacers 29 and 31 are used to block the dopant from completely overlapping lightly doped regions 26A and 27A, it should be understood that their formation is optional. However, it should be noted that spacers 29 and 31 are useful for providing separation between the gate, source, and drain contacts during salicide processes.

Although not shown, source and drain electrodes are typically formed to contact the source 33 and drain 34 regions. Likewise a gate electrode is formed to contact the gate structure 16. Techniques for forming source, drain, and gate electrodes are well known to those skilled in the art.

Figure 7:
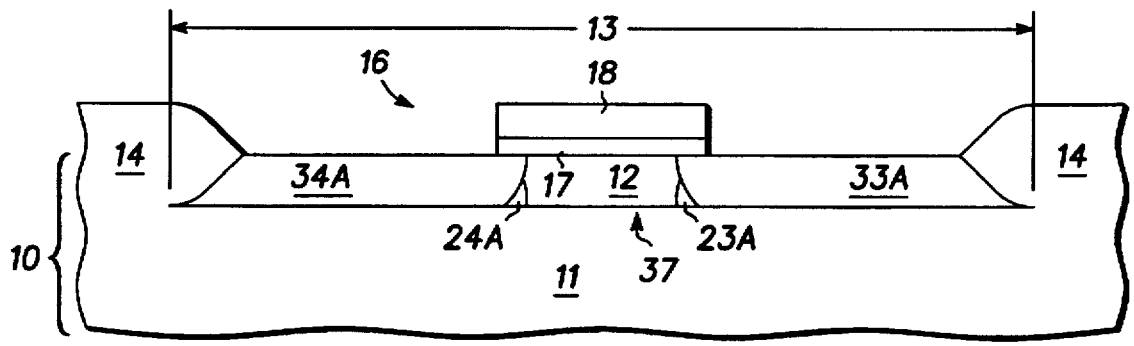
FIG. 7 illustrates a cross-sectional view of an SOI device in accordance with a second embodiment of the present invention.

FIG. 7 illustrates an SOI semiconductor device 45 in accordance with a second embodiment of the present invention. SOI semiconductor device 45 is a bilateral structure that does not have spacers adjacent to sidewalls 19 and 21. Further, SOI semiconductor device 45 does not have lightly doped regions. Accordingly, the source and drain regions 33A and 34A are aligned to sidewalls 19 and 21, respectively. The processing steps used in the formation of SOI semiconductor device 40 are modified to form SOI device 45. In particular, the implant steps for forming lightly doped regions 26A and 27A and the steps for forming spacers 29 and 31 are eliminated. Thus, the structural difference between SOI semiconductor device 40 and SOI semiconductor device 45 is the absence of lightly doped regions 26A and 27A.

Figure 8:
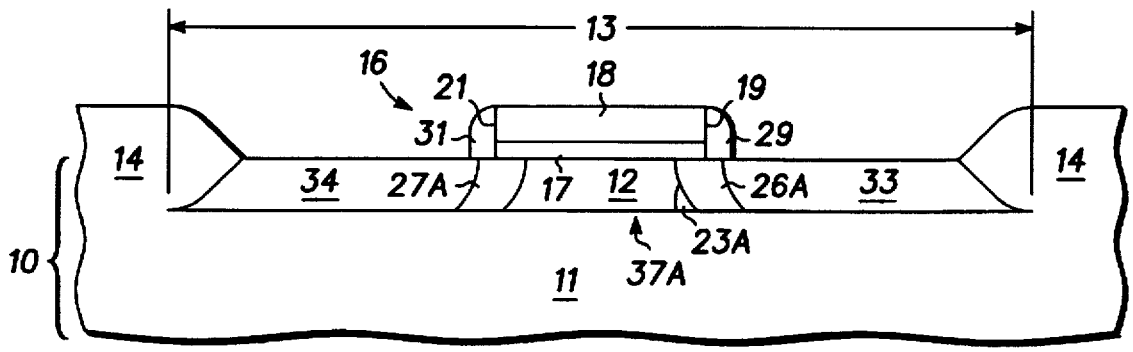
FIG. 8 illustrates a cross-sectional view of an SOI device in accordance with a third embodiment of the present invention.

FIG. 8 illustrates an SOI semiconductor device 50 in accordance with a third embodiment of the present invention. SOI semiconductor device 50 is a unilateral structure having a laterally-graded channel region 23 on one side of a channel region 37A. The processing steps used in the formation of SOI semiconductor device 40 are modified to form SOI device 50. In particular, a layer of photoresist (not shown) is formed over a portion of active region 13 adjacent one side of gate structure 16 prior to the formation of the laterally-graded channel region 23. The layer of photoresist serves as an implant block mask to prevent the formation of a laterally-graded channel region on one side of gate structure 16. Thus, the structural difference between SOI semiconductor device 40 and SOI semiconductor device 50 is the absence of laterally-graded channel region 24A.

For ease of explanation and understanding, all the embodiments have been consistent with the fabrication of an n-channel field effect transistor such as an NMOS device, i.e., an n-channel metal oxide semiconductor field effect transistor. It should be realized, however, that a p-channel field effect transistor such as a PMOS device, i.e., a p-channel metal oxide semiconductor transistor, may be fabricated in accordance with the present invention. As those skilled in the art are aware, the conductivity types of the dopants for a p-channel device are opposite to those of an n-channel device. Thus, the source region, the drain region, the lightly doped regions, and the gates are of p-type conductivity and the laterally graded channel regions and the channel region are of n-type conductivity. In addition, the conductivity type of the gate can be opposite to the conductivity type of the source and drain regions.

By now it should be appreciated that an SOI device having a laterally-graded channel region and a method for making the SOI device have been provided. In accordance with the present invention, the portions of the active region of the SOI device that are not under the gate structure are of a single conductivity type. Further, portions of the channel region under the gate structure and adjacent to the source and/or drain regions have a laterally graded doping profile. Moreover, the dose and energy of the implant used to form doped regions 23 and 24 are designed to keep the dopant at the edge of the lightly doped regions 26A and 27A, respectively, or at the edge of the source and drain regions 33A and 34A, respectively, rather than surrounding regions 26A, 27A, 33A, and 34A after the dopant has been activated. These features of the present invention reduce the device floating body effect, wherein the device has a series resistance comparable to a device without the laterally-graded channel region and a similar source/drain structure. Further, the presence of the dopant adjacent the source and drain regions suppresses the charge induced leakage current of the device. Thus, the present invention improves the performance of the SOI device. In addition, the methods of manufacturing the present invention may be easily implemented using standard SOI processing techniques.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, the lightly doped region that extends under the gate structure may have a higher concentration in the center portion of active region 13 under gate structure 16 than the portions of the lightly doped region adjacent major surface 15 and oxide layer 11, i.e., the doping profile extending under gate structure 16 has a conical shape. In yet another example, the SOI device can be formed using diffusion techniques rather than implant techniques.

We claim:

1. A method for making a semiconductor device, comprising the steps of:

providing a semiconductor-on-insulator substrate having a layer of semiconductor material disposed on a layer of insulator material, the layer of semiconductor material having a major surface;

forming a gate structure having first and second edges over a first portion of the major surface;

forming a first doped region in a first portion of the layer of semiconductor material, the first doped region of a first conductivity type and extending vertically from the major surface to the layer of insulator material, extending to underlie the gate structure, and extending laterally in the layer of semiconductor material from the first edge in a direction away from the gate structure;

forming a second doped region in a second portion of the layer of semiconductor material, the second doped region of the first conductivity type and extending vertically from the major surface to the layer of insulator material, extending to underlie the gate structure, and extending laterally in the layer of semiconductor material from the second edge in a direction away from the gate structure; and forming a third doped region in a third portion of the layer of semiconductor material, the third doped region of a second conductivity type, adjacent a portion of the first doped region that is adjacent the layer of insulator material, and wherein the third doped region is spaced apart from the major surface, and between the first and second portions of the layer of semiconductor material.

2. A method as claimed in claim 1, further including the step of forming a fourth doped region in a fourth portion of the layer of semiconductor material, the fourth doped region of the second conductivity type, adjacent a portion of the second doped region that is adjacent the layer of insulator material, wherein the fourth doped region is spaced apart from the major surface and between the first and second portions of the layer of semiconductor material.

3. A method as claimed in claim 1, wherein the step of forming the first doped region and the step of forming the second doped region includes implanting a dopant of the first conductivity type into the first and second portions of the layer of semiconductor material, and activating the dopant of the first conductivity type and the step of forming the third doped region includes implanting a dopant of the second conductivity type into the third portion of the layer of semiconductor material, and activating the dopant of the second conductivity type.

4. A method as claimed in claim 3, wherein the step of activating the dopant of the first conductivity type and the step of activating the dopant of the second conductivity type includes annealing the layer of semiconductor material.

5. A method as claimed in claim 1, further including the steps of:

forming a spacer adjacent the first edge;

implanting a dopant of the first conductivity type into first and second portions of the layer of semiconductor material; and activating the dopant of the first conductivity type.

6. A method as claimed in claim 3 further including the step of forming a fourth doped region in a fourth portion of the layer of semiconductor material, the fourth doped region of the second conductivity type, adjacent a portion of the second doped region that is adjacent the layer of insulator material, wherein the fourth doped region is spaced apart from the major surface and between the first and second portions of the layer of semiconductor material.

7. A method for fabricating a semiconductor device, comprising the steps of:

providing a semiconductor-on-insulator substrate having a layer of semiconductor material disposed on a layer of insulator material, the layer of semiconductor material having a major surface;

forming an active area in a portion of the layer of semiconductor material;

forming a gate structure having first and second edges over a portion of the active area;

forming a first doped region of a first conductivity type in a first portion of the active area aligned to the first edge of the gate structure;

forming a second doped region of the first conductivity type in a portion of the active area aligned to the second edge of the gate structure;

forming a third doped region of a second conductivity type in a second portion of the active area aligned to the first edge of the gate structure;

forming a lightly doped region of a first conductivity type in a portion of the active area adjacent a first side of the gate structure by activating the first doped region, the lightly doped region formed below the gate structure;

forming a laterally-graded channel region of a second conductivity type in a portion of the active area below the gate structure and abutting the lightly doped region by activating the third doped region, the laterally-graded channel region abutting the lightly doped region, adjacent the layer of insulator material and spaced apart from the major surface;

forming a source region in a portion of the lightly doped region, the source region extending to underlie the gate structure; and forming a drain region in a portion of the active area adjacent a second side of the gate structure, the drain region extending to underlie the gate structure.

8. The method of claim 7, wherein the step of forming a first doped region includes implanting the dopant of the first conductivity type into the first portion of the active area, and the step of forming a third doped region includes implanting a dopant of the second conductivity type into the second portion of the active area.

9. The method of claim 7 wherein the steps of forming a first doped region of a first conductivity type and forming a third doped region of a second conductivity type include using a dose of the dopant used to form the first doped region and a dose of the dopant used to form the third doped region such that a ratio of a net dose in the first doped region to a net dose in the third doped region is at least one.

* * * * *

UNITED STATES PATENT AND TRADEMARK OFFICE
CERTIFICATE OF CORRECTION

PATENT NO. : 5,670,389
DATED : Sepember 23, 1997
INVENTOR(S) : Margaret Wen-Ling Huang et al.

It is certified that error appears in the above-indentified patent and that said Letters Patent is hereby corrected as shown below:

In Claim 6, column 8, line 7, delete the number "3" and insert --5--, therefor.

Signed and Sealed this

Ninth Day of December, 1997

Attest:

BRUCE LEHMAN

Attesting Officer

Commissioner of Patents and Trademarks